(12) United States Patent
Inoue et al.

(10) Patent No.: US 12,183,599 B2
(45) Date of Patent: Dec. 31, 2024

(54) SUBSTRATE TREATMENT DEVICE AND SUBSTRATE TREATMENT METHOD

(71) Applicant: SCREEN Holdings Co., Ltd., Kyoto (JP)

(72) Inventors: Masafumi Inoue, Kyoto (JP); Eiji Fukatsu, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 868 days.

(21) Appl. No.: 17/279,626

(22) PCT Filed: Sep. 11, 2019

(86) PCT No.: PCT/JP2019/035767
§ 371 (c)(1),
(2) Date: Mar. 25, 2021

(87) PCT Pub. No.: WO2020/084944
PCT Pub. Date: Apr. 30, 2020

(65) Prior Publication Data
US 2021/0391188 A1    Dec. 16, 2021

(30) Foreign Application Priority Data
Oct. 22, 2018    (JP) ................................. 2018-198452

(51) Int. Cl.
*H01L 21/67* (2006.01)
*B08B 3/00* (2006.01)
(Continued)

(52) U.S. Cl.
CPC ............ *H01L 21/6708* (2013.01); *B08B 3/00* (2013.01); *G01J 5/48* (2013.01); *H01L 21/306* (2013.01);
(Continued)

(58) Field of Classification Search
CPC ............. H01L 21/306; H01L 21/67253; H01L 21/673; H01L 21/6708; H01L 21/304;
(Continued)

(56) References Cited

U.S. PATENT DOCUMENTS

2003/0003607 A1 * 1/2003 Kagoshima ....... H01J 37/32935
118/712
2006/0096951 A1 * 5/2006 Natzle .............. H01L 21/67109
118/724
(Continued)

FOREIGN PATENT DOCUMENTS

CN    1380541 A    11/2002
CN    108010838 A    5/2018
(Continued)

OTHER PUBLICATIONS

Notice of Decision to Grant dated Nov. 30, 2022 in corresponding Korean Patent Application No. 10-2021-7011699.
(Continued)

*Primary Examiner* — Yuechuan Yu
(74) *Attorney, Agent, or Firm* — OSTROLENK FABER LLP

(57) ABSTRACT

A substrate holder holds a substrate at a predetermined position. An etching solution supply unit supplies an etching solution to the substrate at the predetermined position. A rotating unit rotates the substrate holder about a predetermined rotation axis. A temperature distribution acquisition unit acquires the temperature distribution in a peripheral area around the substrate area occupied by the substrate when the substrate is arranged at the predetermined position in a chamber. A feature value calculator calculates, from the temperature distribution, a feature value relating an etching amount of the substrate by the etching using the etching solution.

13 Claims, 8 Drawing Sheets

(51) Int. Cl.
  *G01J 5/48* (2022.01)
  *H01L 21/306* (2006.01)
  *H01L 21/673* (2006.01)
  *H01L 21/687* (2006.01)

(52) U.S. Cl.
  CPC ...... *H01L 21/67248* (2013.01); *H01L 21/673* (2013.01); *H01L 21/68764* (2013.01)

(58) Field of Classification Search
  CPC ......... H01L 21/67248; H01L 21/68764; B08B 3/00; G01J 5/48; G01J 2005/0077; G01J 5/0007
  See application file for complete search history.

(56) References Cited

U.S. PATENT DOCUMENTS

| | | | |
|---|---|---|---|
| 2009/0032498 A1 | 2/2009 | Tsuchiya et al. | |
| 2009/0097950 A1* | 4/2009 | Tanaka | H01L 21/67276 414/806 |
| 2014/0197129 A1 | 7/2014 | Fujii et al. | |
| 2015/0273534 A1* | 10/2015 | Ootagaki | H01L 21/6708 134/18 |
| 2016/0005630 A1* | 1/2016 | Fujiwara | H01L 21/6708 438/748 |
| 2018/0090306 A1 | 3/2018 | Higashijima et al. | |
| 2018/0151385 A1 | 5/2018 | Chuang et al. | |

FOREIGN PATENT DOCUMENTS

| | | |
|---|---|---|
| JP | H04-348513 A | 12/1992 |
| JP | 2005-311012 A | 11/2005 |
| JP | 2007-335709 A | 12/2007 |
| JP | 2009-231732 A | 10/2009 |
| JP | 2013-16534 A | 1/2013 |
| JP | 2015-191895 A | 11/2015 |
| JP | 2016-015395 A | 1/2016 |
| JP | 2017-201723 A | 11/2017 |
| KR | 10-2015-0122902 A | 11/2015 |
| KR | 10-2018-0035151 A | 4/2018 |
| KR | 10-2018-0062316 A | 6/2018 |
| WO | WO 2006/103773 A1 | 10/2006 |
| WO | WO 2015/037035 A1 | 3/2015 |
| WO | WO 2018/110301 A1 | 6/2018 |

OTHER PUBLICATIONS

International Search Report mailed Nov. 26, 2019 in corresponding PCT International Application No. PCT/JP2019/035767.
Written Opinion mailed Nov. 26, 2019 in corresponding PCT International Application No. PCT/JP2019/035767.
Office Action mailed Jul. 21, 2020 in corresponding Taiwanese Patent Application No. 108135676.
First Office Action with Search Report dated Jul. 30, 2024 in corresponding Chinese Patent Application No. 201980067612.3.

* cited by examiner

F I G. 1
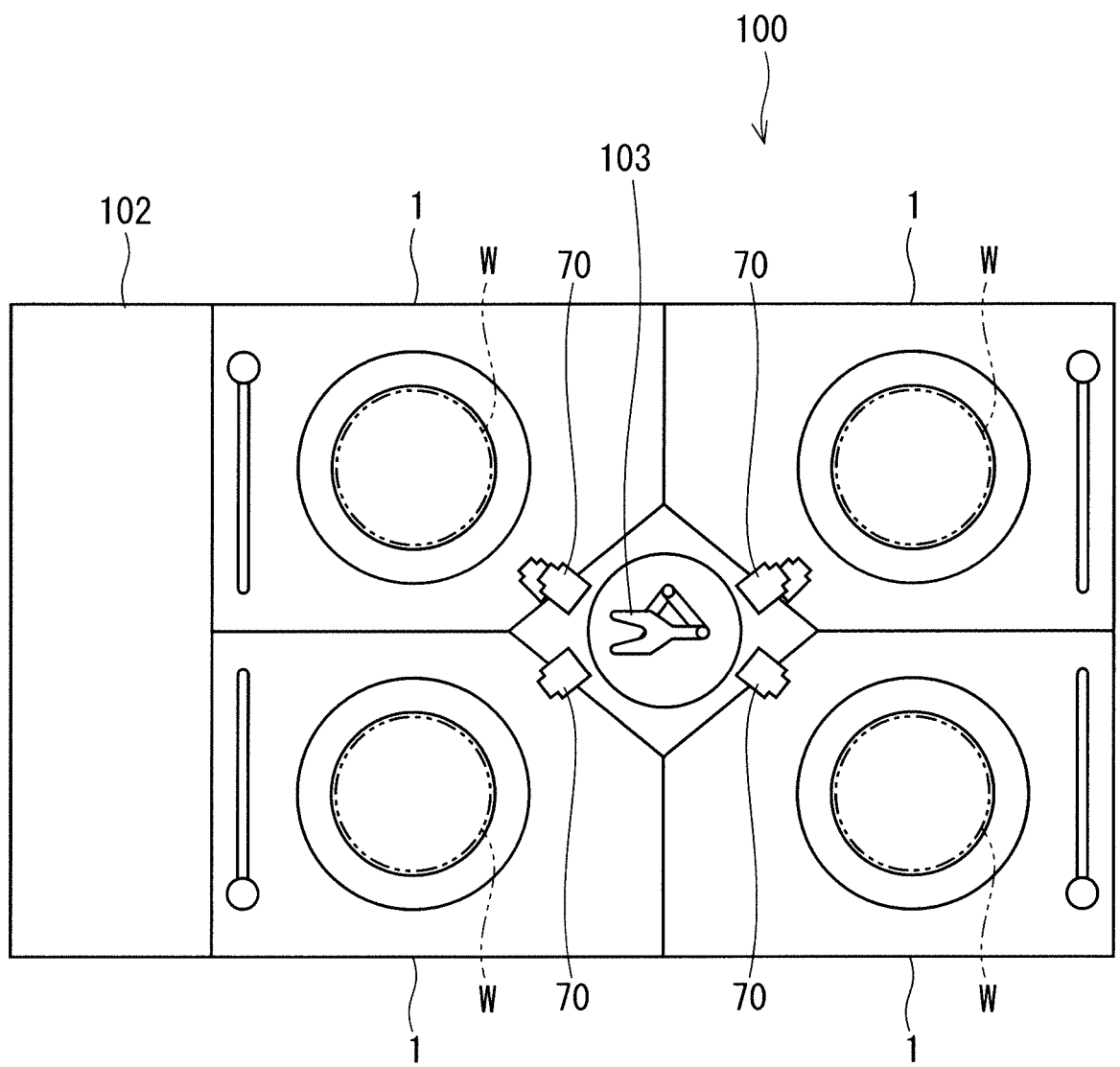

SUBSTRATE TREATMENT DEVICE AND SUBSTRATE TREATMENT METHOD

CROSS-REFERENCE TO RELATED APPLICATIONS

The present application is a 35 U.S.C. §§ 371 national phase conversion of International Application No. PCT/JP2019/035767, filed Sep. 11, 2019, which claims priority to Japanese Patent Application No. 2018-198452, filed Oct. 22, 2018, the contents of both of which are incorporated herein by reference. The PCT International Application was published in the Japanese language.

TECHNICAL FIELD

The present invention relates to a technique for etching a substrate. For example, for a substrate being a treatment object includes a semiconductor substrate, a Flat Panel Display (FPD) substrate for liquid crystal display devices and organic Electroluminescence (EL) display devices, an optical disc substrate, a magnetic disk substrate, a magneto-optical disk substrate, a photomask substrate, a ceramic substrate, substrates for solar cells, a printed substrate, and the like.

BACKGROUND ART

Conventionally, an etching solution is supplied to the surface of a substrate for etching. Prior arts related to the present invention include, for example, those described in Patent Documents 1 and 2. Patent Documents 1 and 2 disclose that the etching treatment is performed in a state where the substrate is at an appropriate temperature by monitoring the temperature of the substrate surface and stopping the supply of the etching solution when the substrate temperature reaches the target temperature.

PRIOR ART DOCUMENTS

Patent Documents

[Patent Document 1] Japanese Patent Application Laid-Open No. 2015-191895
[Patent Document 2] Japanese Patent Application Laid-Open No. 2017-201723

SUMMARY

Problem to be Solved by the Invention

However, the etching treatment may possibly be affected not only by the temperature of the substrate but also by the ambient temperature of the substrate. In the prior art, only the temperature of the substrate surface is monitored, and the influence of the ambient temperature around the substrate on the etching is not counted. Therefore, due to radiant heat from the members around the substrate, a defect may possibly occur in the etching treatment.

An object of the present invention is to provide a technique for suitably performing an etching treatment on a substrate.

Means to Solve the Problem

To solve the above problems, a first aspect is a substrate treatment device configured to perform etching on a substrate, including a chamber having a treatment space therein, a substrate holder configured to hold the substrate in a predetermined position in the chamber, an etching solution supply unit configured to supply an etching solution to the substrate held by the substrate holder, a rotating unit configured to rotate the substrate holder about a predetermined rotation axis, a temperature distribution acquisition unit configured to acquire a temperature distribution in a peripheral area around a substrate area occupied by the substrate when arranged at the predetermined position in the chamber, and a feature value calculator configured to calculate a feature value relating to an etching amount of the substrate by the etching using the etching solution from the temperature distribution.

A second aspect is the substrate treatment device of the first aspect, further including an etching determination unit configured to determine a quality of the etching on the substrate based on comparison between the feature value and a predetermined threshold value.

A third aspect is the substrate treatment device of the first aspect or the second aspect, in which the feature value calculator calculates the feature value from a relational expression representing a relationship between the temperature distribution and the etching amount.

A fourth aspect is the substrate treatment device of the third aspect, further including a relational expression generator configured to generate the relational expression based on the temperature distribution at a predetermined timing in the etching and the etching amount of the substrate on which the etching has been performed.

A fifth aspect is the substrate treatment device of the fourth aspect, in which the feature value calculator calculates the feature value by substituting the temperature distribution at a timing corresponding to the predetermined timing in the etching into the relational expression.

A sixth aspect is the substrate treatment device of any one of the third aspect to the fifth aspect, in which the etching amount is an etching amount on each circumference having a different radius with the rotation axis being a center.

A seventh aspect is the substrate treatment device of any one of the first aspect to the sixth aspect, in which the temperature distribution acquisition unit includes a thermographic camera whose imaging area includes an area where the substrate held on the substrate holder is arranged, and the temperature distribution is a thermography.

An eighth aspect is the substrate treatment device of the seventh aspect, in which the relational expression is a regression function in which a temperature indicated by each pixel value constituting the thermography is an independent variable and the etching amount on each circumference of the different radius is a dependent variable.

A ninth aspect is the substrate treatment device of any one of the first aspect to the eighth aspect, in which the feature value calculator is configured to calculate the feature value from the temperature distribution acquired in a state where the substrate holder does not hold the substrate.

A tenth aspect is the substrate treatment device of the ninth aspect, further including a temperature change unit configured to change the temperature of the substrate arranged at the predetermined position and the peripheral area in accordance with the feature value.

An eleventh aspect is the substrate treatment device of the ninth aspect or the tenth aspect, further including a schedule change unit configured to change a schedule that defines a time for the substrate to be carried into the chamber according to the feature value.

A twelfth aspect is the substrate treatment device of any one of the first aspect to the eighth aspect, in which the feature value calculator is configured to calculate the feature value from the temperature distribution acquired in a state where the substrate holder holds the substrate.

A thirteenth aspect is the substrate treatment device of the twelfth aspect, further including a temperature change unit configured to change the temperature of the substrate arranged at the predetermined position and the peripheral area in accordance with the feature value.

A fourteenth aspect is the substrate treatment device of the twelfth aspect or the thirteenth aspect, further including a temperature change unit configured to change a schedule that defines a time for the substrate to be carried into the chamber according to the feature value.

A fifteenth aspect is a substrate treatment method including the steps of a) holding a substrate in a predetermined position in a chamber, b) rotating the substrate in the predetermined position by the step a) about a rotation axis, c) supplying an etching solution to a surface of the substrate being rotated by the step b), d) acquiring a temperature distribution in a peripheral area around a substrate area occupied by the substrate when arranged at the predetermined position in the chamber, and e) calculating a feature value for evaluation of an etching treatment using the etching solution on the substrate from the temperature distribution acquired in the step d).

Effects of the Invention

According to the substrate treatment device of the first aspect, the feature value regarding the etching amount of the substrate is calculated from the temperature distribution around the area where the substrate is arranged. Therefore, based on the feature value, an appropriate evaluation of whether or not etching defects occur due to the ambient temperature of the substrate is performed.

According to the substrate treatment device of the second aspect, a quality of the etching treatment to the substrate is appropriately determined from the temperature distribution in the peripheral area by the appropriate setting of the threshold value by the operator.

According to the substrate treatment device of the third aspect, the prediction value of the etching amount is calculated by substituting the temperature distribution into the relational expression.

According to the substrate treatment device of the fourth aspect, the relational expression for predicting the etching amount is obtained from the temperature distribution at the predetermined timing.

According to the substrate treatment device of the fifth aspect, an acquisition timing of the temperature distribution to be substituted into the relational expression for calculating the feature value is adjusted to the predetermined timing of the temperature distribution used for generating the relational expression. Therefore, the feature value is appropriately acquired from the relational expression and the temperature distribution.

According to the substrate treatment device of the sixth aspect, the etching treatment is performed while rotating the substrate; therefore, the amount of etching on the same circumference on the substrate is substantially uniform. Therefore, the distribution of the etching amount on the substrate is efficiently acquired by acquiring the etching amount on each circumference having a different radius.

According to the substrate treatment device of the seventh aspect, the temperature distribution around the area where the substrate is arranged is easily acquired by taking an image with the thermographic camera.

According to the substrate treatment device of the eighth aspect, when the substrate is treated with the etching solution while being rotated, the etching amount is substantially the same on each circumference having a different radius. Therefore, the dependent variable is reduced by setting the etching amount on the circumferences of different radii as the dependent variable. As a result, a relational expression for obtaining the etching amount at each point on the substrate is appropriately and efficiently generated.

According to the substrate treatment device of the ninth aspect, inspection on whether or not the temperature distribution around the area where the substrate is arranged is suitable for etching is conducted before the substrate is held on the substrate holder based on the feature value.

According to the substrate treatment device of the tenth aspect, the temperature distribution around the area where the substrate is arranged is changed so as to be suitable for the etching treatment; therefore, the suitable etching treatment is performable.

According to the substrate treatment device of the eleventh aspect, the carrying-in of the substrate is delayed so that the temperature distribution around the area where the substrate is arranged becomes an appropriate temperature. Consequently, defects in the etching treatment on the substrate are suppressed.

According to the substrate treatment device of the twelfth aspect, an inspection on whether or not the temperature distribution around the area where the substrate is arranged is suitable for etching is conducted after the substrate is held on the substrate holder based on the feature value.

According to the substrate treatment device of the thirteenth aspect, the temperature distribution of a periphery of the substrate is changed so as to be suitable for the etching treatment; therefore, the suitable etching treatment is performable.

According to the substrate treatment device of the fourteenth aspect, the carrying-in of the substrate is delayed until the temperature distribution of the peripheral of the substrate becomes the appropriate temperature for the etching treatment. Consequently, defects in the etching treatment are suppressed.

According to the substrate treatment method of the fifteenth aspect, the feature value regarding the etching amount of the substrate is calculated from the temperature distribution around the area where the substrate is arranged. Therefore, based on the feature value, an appropriate evaluation of whether or not etching defects occur due to the ambient temperature of the substrate is performed.

BRIEF DESCRIPTION OF DRAWINGS

FIG. 1 A diagram illustrating an overall configuration of a substrate treatment device 100 according to Embodiment 1.

DESCRIPTION OF EMBODIMENTS

Figure 2:
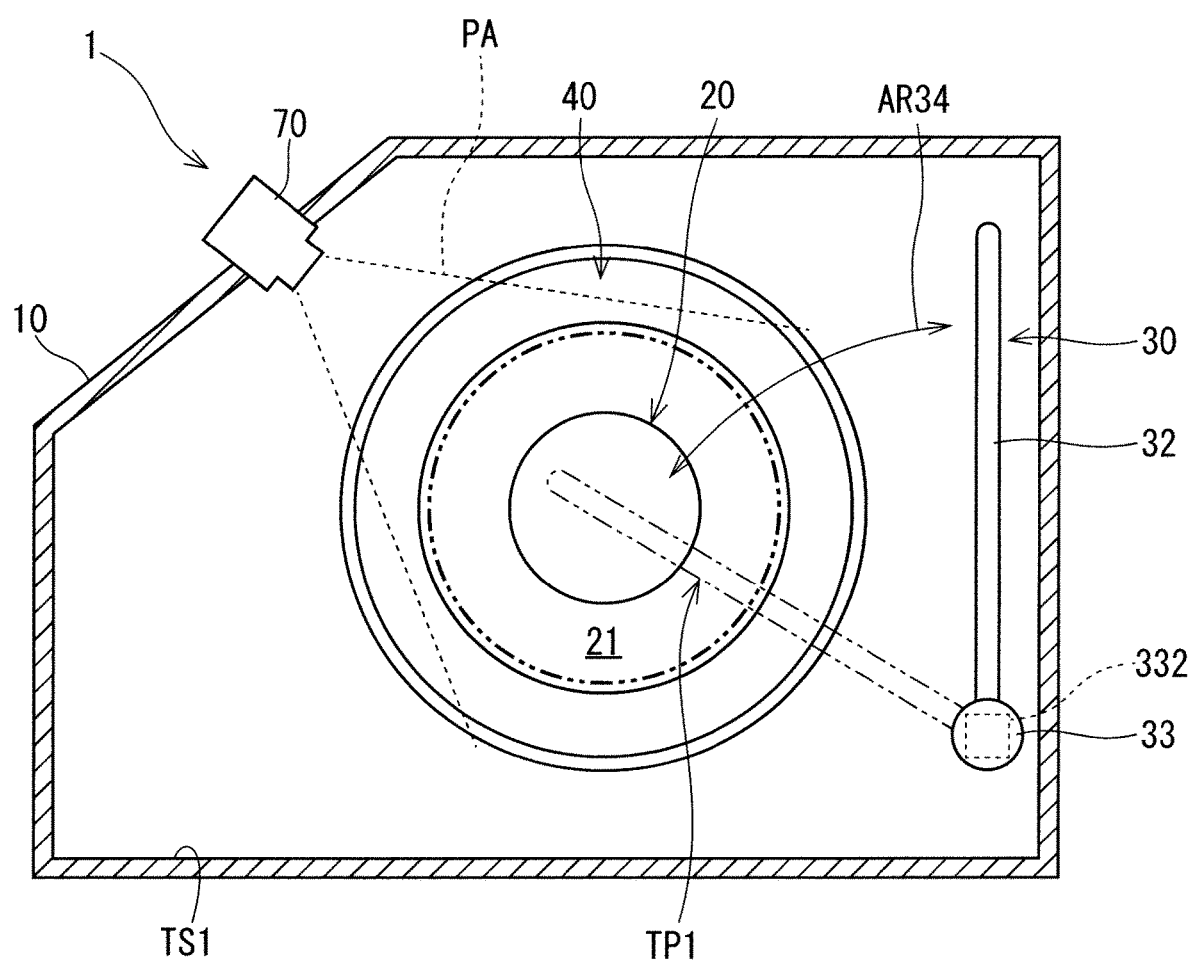
FIG. 2 A schematic plan view of a cleaning treatment unit 1 according to Embodiment 1.

Embodiments of the present invention will be described with reference to the drawings. It should be noted that the components described in Embodiments are merely examples, and the scope of the present invention is not limited thereto. In the drawings, the dimensions and numbers of each part may be exaggerated or simplified as necessary for easy understanding.

Terms that express relative or absolute positional relationship (for example, "in one direction" "along one direction", "parallel", "orthogonal", "center", "concentric", "coaxial", etc.) express not only the precise positional relationship, but also express a state of being displaced relative to an angle or distance to the extent that tolerance or similar functionality is obtained, unless otherwise specified. Terms that express the state of being equal (for example, "same", "equal", "homogeneous", etc.) express not only the state of being exactly equal quantitative-wise, but also express a state involving tolerance or differences with which similar functionality is obtained. Terms that express shapes (for example, "square" or "cylindrical", etc.) not only precisely express the shapes geometrically, but also express a shape having, for example, unevenness or chamfering portions, within a range that provides the same effect, unless otherwise specified. Expressions that an X "is provided with", "is equipped with", "is furnished with", "includes", or "has" a component are not exclusive expressions that exclude the existence of other components. A term that expresses "B above/on A" includes the case where the two elements A and B are in contact with each other and the case where the two elements A and B are separated from each other, unless otherwise specified.

1. Embodiment 1

FIG. 1 is a diagram illustrating an overall configuration of a substrate treatment device 100 according to Embodiment 1. The substrate treatment device 100 is a single-wafer treatment device that treats the treatment object substrates W one by one. The substrate treatment device 100 performs a cleaning treatment on the substrate W, which is a silicon substrate having a circular thin plate shape, with an etching solution and a rinsing solution such as pure water, and then performs a drying treatment. As the etching solution, various chemicals containing hydrofluoric acid, nitric acid and the like may be adopted. As the rinsing solution, various solutions such as pure water and ultrapure water may be adopted. In the following description, the etching solution and the rinsing solution are collectively referred to as "treatment solution" in some cases.

The substrate treatment device 100 includes a plurality of cleaning treatment units 1, an indexer 102, and a main transfer robot 103.

The indexer 102 conveys the treatment object substrates W received from outside the device into the device, and carries out the treated substrates W for which the cleaning treatment has been completed to the outside of the device. The indexer 102 mounts a plurality of carriers (not illustrated) and includes a transfer robot (not illustrated). As a carrier, a Front Opening Unified Pod (FOUP) or a Standard Mechanical InterFace (SMIF) pod that stores the substrate W in a closed space, or an Open Cassette (OC) that exposes the substrate W to the outside air may be adopted. The transfer robot transfers the substrate W between the carrier and the main transfer robot 103.

The cleaning treatment unit 1 performs a solution treatment and the drying treatment on one substrate W. Twelve cleaning treatment units 1 are arranged in the substrate treatment device 100. Specifically, four towers including three cleaning treatment units 1 each stacked in the vertical direction are arranged so as to surround the main transport robot 103. FIG. 1 schematically illustrates one of the cleaning treatment units 1 stacked in three stages. The number of cleaning treatment units 1 in the substrate treatment device 100 is not limited to 12, and may be changed as appropriate.

The main transfer robot 103 is installed in the center among the four towers in which the cleaning treatment units 1 are stacked. The main transfer robot 103 carries the treatment object substrate W received from the indexer 102 into each cleaning treatment unit 1. Also, the main transfer robot 103 carries out the treated substrate W from each cleaning treatment unit 1 and passes the substrate W to the indexer 102.

<Cleaning Treatment Unit 1>

Hereinafter, although one of the 12 cleaning treatment units 1 mounted on the substrate treatment device 100 will be described, the other cleaning treatment units 1 have the same configuration except the different arrangement of the nozzles 30.

Figure 3:
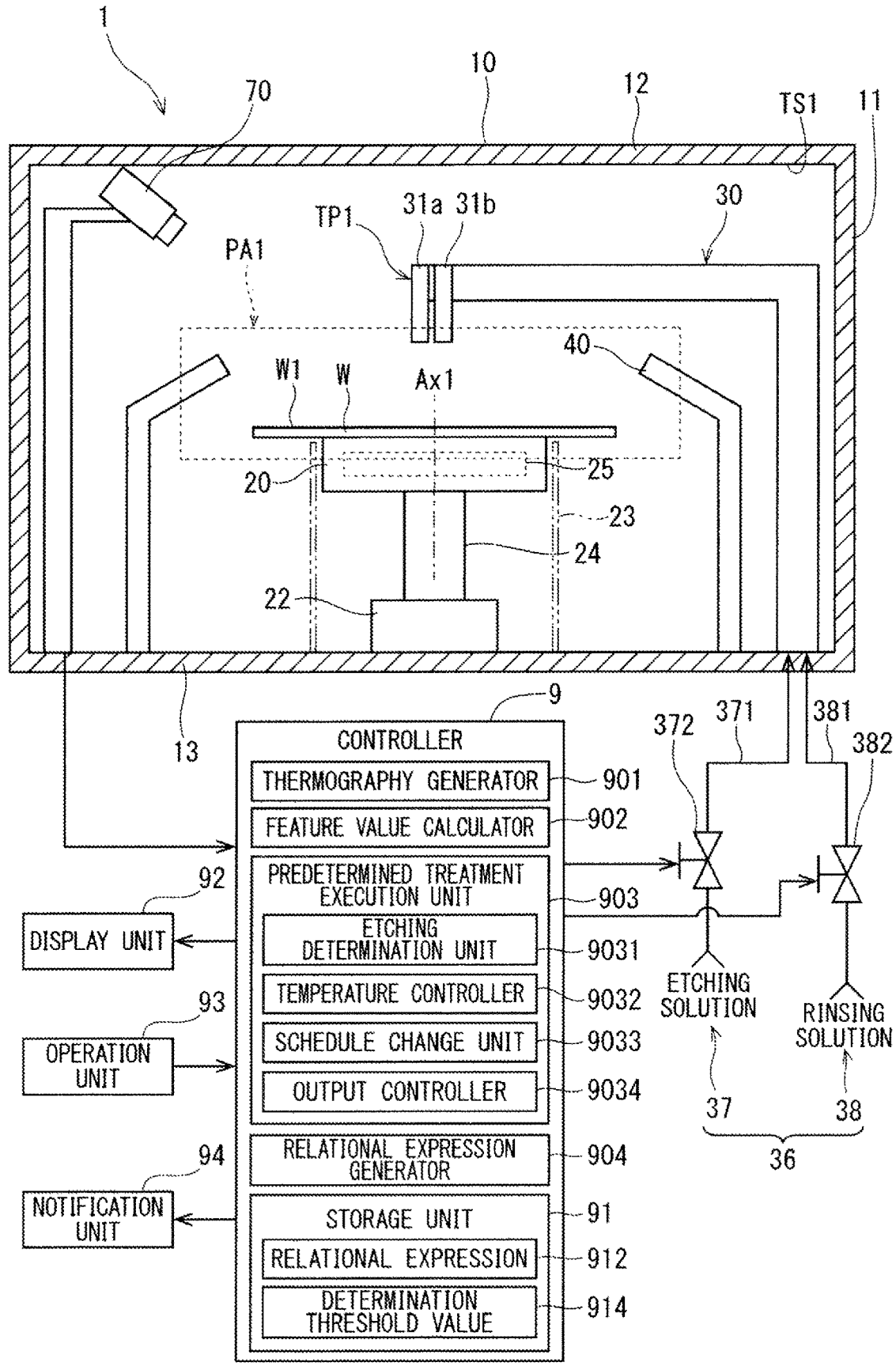
FIG. 3 A diagram illustrating the cleaning treatment unit 1 and a controller 9 according to Embodiment 1.

FIG. 2 is a schematic plan view of a cleaning treatment unit 1 according to Embodiment 1. FIG. 3 is a diagram illustrating the cleaning treatment unit 1 and a controller 9 according to Embodiment 1. FIG. 2 illustrates a state in which the substrate W is not held on the substrate holding stage 20, and FIG. 3 illustrates a state in which the substrate W is held on the substrate holding stage 20.

In its chamber 10, the cleaning treatment unit 1 includes a substrate holding stage 20 that holds the substrate W in a horizontal posture (a posture in which the normal line of the surface of the substrate W is along the vertical direction), a nozzle 30 for supplying a treatment solution to the upper surface of the substrate W held on the substrate holding stage 20, a treatment cup 40 surrounding the substrate holding stage 20, and a thermographic camera 70 for imaging the upper space of the substrate holding stage 20.

The chamber 10 has a treatment space TS1 for treating a substrate therein. A side wall that surrounds all four sides in the vertical direction, a ceiling wall that closes the upper side of the side wall, and a floor wall 13 that closes the lower side of the side wall 11 are provided. The space surrounded by the side wall 11, the ceiling wall 12, and the floor wall 13 forms the treatment space TS1. A part of the side wall 11 of the chamber 10 is provided with a carry-in/out port for the main transfer robot 103 to carry in/out the substrate W into the chamber 10 and a shutter for opening/closing the carry-in/out port (both not illustrated).

The substrate holding stage 20 is fixed to the upper end of a rotation shaft 24 extending along the vertical direction. The central portion of the lower end of the substrate holding stage 20 is connected to the rotation shaft 24. A spin motor 22 is connected to the rotation shaft 24. The spin motor 22 rotates the rotation shaft 24 about a rotation axis Ax1 in accordance with a control command from the controller 9. The spin motor 22 rotates the substrate holding stage 20 in a horizontal plane by rotating the rotation shaft 24. The substrate holding stage 20 is an example of a substrate holder that holds the substrate W at a predetermined position in the chamber 10. The spin motor 22 and the rotation shaft 24 are an example of a rotating unit that rotates the substrate holding stage 20 being a substrate holder about the predetermined rotation axis Ax1. The substrate holding stage 20, the spin motor 22, and the rotation shaft 24 are surrounded by a cover member 23.

The substrate holding stage 20 has a disk shape. The outer diameter of the substrate holding stage 20 is smaller than the diameter of the circular substrate W held on the substrate holding stage 20. The substrate holding stage 20 has an upper surface 21 facing a part of the lower surface of the holding object substrate W. A plurality of suction holes are provided on the upper surface 21 in a dispersed manner. Each suction hole is connected to a suction means such as a vacuum pump. When the suction means is operated with the substrate W being placed on the upper surface 21 of the substrate holding stage 20, the atmosphere between the substrate W and the upper surface 21 is sucked into each suction hole. As a result, the substrate W is adsorbed onto the upper surface 21. The substrate holding stage 20 is an example of a substrate holder that holds the substrate at a predetermined position in a substrate chamber.

It should be noted that, the provision of the substrate holding stage 20 in which the substrate holder adsorbs the substrate W is not inevitable. For example, the substrate holder may include a plurality of chuck pins for holding the substrate W by supporting different portions of the outer edge portion of the substrate W.

When the spin motor 22 rotates the rotation shaft 24 with the substrate holding stage 20 being holding the substrate W, the substrate W rotates about the rotation axis Ax1 extending along the vertical direction passing through the center of the substrate W. The drive of the spin motor 22 is controlled by the controller 9. In the following description, the horizontal direction orthogonal to the rotation axis Ax1 is referred to as the "radial direction". Also, the direction toward the rotation axis Ax1 in the radial direction is referred to as "inward in the radial direction", and the direction away from the rotation axis Ax1 in the radial direction is referred to as "outward in the radial direction".

The nozzle 30 includes discharge heads 31a and 31b, and a nozzle arm 32. The discharge heads 31a and 31b are attached to the tip end of the nozzle arm 32. The base end side of the nozzle arm 32 is fixed on and connected to the nozzle base 33. A motor 332 (nozzle moving unit, see FIG. 2) provided on the nozzle base 33 enables the rotational move about an axis extending along the vertical direction.

The rotational move of the nozzle base 33 moves the nozzle 30 in the horizontal direction in a circular-arc trajectory between the position above the substrate holding stage 20 and the standby position outside the treatment cup 40, as illustrated by the arrow AR34 in FIG. 2. That is, the rotational move of the nozzle base 33 swings the nozzle 30 above the upper surface 21 of the substrate holding stage 20. Specifically, above the substrate holding stage 20, the nozzle 30 moves to a predetermined treatment position TP1 extending in the horizontal direction. Noted that, moving the nozzle 30 to the treatment position TP1 agrees with moving the discharge heads 31a and 31b at the tip end portion of the nozzle 30 to the treatment position TP1.

A treatment solution supply unit 36 is connected to the nozzle 30. The treatment solution supply unit 36 includes an etching solution supply unit 37 and a rinsing solution supply unit 38. The etching solution supply unit 37 is connected to the discharge head 31a and supplies the etching solution to the discharge head 31a. The discharge head 31a discharges the etching solution toward the upper surface of the rotating substrate W. The rinsing solution supply unit 38 is connected to the discharge head 31b and supplies the rinsing solution to the discharge head 31b. The discharge head 31b discharges the rinsing solution toward the upper surface of the rotating substrate W.

The etching solution supply unit 37 includes a pipe 371 that connects an etching solution supply source and the discharge head 31a, and a valve 372 provided in the pipe 371. The rinsing solution supply unit 38 includes a pipe 381 that connects the rinsing solution supply source and the discharge head 31b, and a valve 382 provided in the pipe 381. The supply valves 372 and 382 open and close the respective pipes 371 and 381 in accordance with the control signal from the controller 9. With this configuration, the on/off control of the supply of the treatment solution to the discharge heads 31a and 31b and the on/off control of the discharge of the treatment solution from the discharge heads 31a and 31b are simultaneously performed.

The number of discharge heads provided on the nozzle 30 is not limited to two, and one or three or more discharge heads may be provided. Also, a discharge head may be provided for each type of treatment solution, or two or more types of treatment solutions may be discharged from the same discharge head. Or, separate from the nozzle 30, a nozzle for supplying the treatment solution to the substrate W may be provided.

As described above, the nozzle 30 (specifically, each discharge head 31a and 31b) stops at the treatment position TP1 and discharges the treatment solution. The treatment solution discharged from the nozzle 30 lands on the upper surface of the substrate W at the predetermined position held on the substrate holding stage 20.

A heat source 25 is built in the substrate holding stage 20. The heat source 25 generates heat in accordance with a control signal from the controller 9. With this configuration, the temperature of the substrate holding stage 20 and the elements arranged around the substrate holding stage 20 is changed. As a result, the substrate W held on the substrate holding stage 20 is heated. The heat source 25 may form a temperature changing unit that changes the temperature of the substrate W arranged at the predetermined position and its peripheral area PA1.

The temperature changing unit that changes the temperature of the substrate W is not limited to the heat source 25 built in the substrate holding stage 20. For example, as the temperature changing unit, a heat source may be adopted, which is provided outside the substrate holding stage 20 and in the treatment space TS1 of the chamber 10 and gives the radiant heat to the substrate W. Further, as the temperature changing unit, a cooling mechanism for cooling the substrate holding stage 20 or its surroundings may be provided.

The treatment cup 40 has a cylindrical shape that can surround the outer circumference of the substrate holding stage 20. The upper portion of the treatment cup 40 has a shape that is inclined vertically upward and inward in the radial direction. When the substrate W is held on the substrate holding stage 20, the upper portion of the treatment cup 40 described above surrounds the substrate W.

When the treatment solution is supplied to the upper surface of the substrate W held on the substrate holding stage 20, the treatment solution is flung off outward in the radial direction by the rotation of the substrate W. The treatment cup 40 receives the treatment solution flung off from the substrate W on the inner peripheral surface of the upper portion thereof. The treatment solution received on the inner peripheral surface falls and is appropriately discharged from the chamber 10. The substrate W may be surrounded by a portion below the upper portion of the treatment cup 40.

A lifting mechanism for moving the upper end portion of the treatment cup 40 in the vertical direction may be provided. In this case, when the substrate W is carried onto the substrate holding stage 20, the upper end of the treatment cup 40 is lowered below the upper surface 21 to prevent the substrate W from interfering with the treatment cup 40.

The thermographic camera 70 includes an optical system such as a semiconductor sensor for detecting heat such as an infrared sensor and a condenser lens. The imaging direction of the thermographic camera 70 (that is, the optical axis direction of the imaging optical system) is set diagonally downward toward the center of rotation (or its vicinity) of the upper surface of the substrate W in order to image the upper surface of the substrate W held on the substrate holding stage 20. In the horizontal direction, an imaging area PA surrounded by the broken line in FIG. 2 is included in the field of vision of the thermographic camera 70.

The imaging area PA of the thermographic camera 70 is set to include the peripheral area PA1 around a substrate area occupied by the substrate W when the substrate W is held on the substrate holding stage 20 in the treatment space TS1 in the chamber 10.

The electric signal output from the semiconductor sensor of the thermographic camera 70 is input to the controller 9. A thermography generator 901 of the controller 9 generates a thermography in accordance with the input electric signal. The thermography is an example of information indicating the temperature distribution in the imaging area PA (including the peripheral area PA1) of the thermographic camera 70.

In the example illustrated in FIG. 3, the peripheral area PA1 includes members arranged around the substrate W such as the upper end portion of the treatment cup 40, the upper surface W1 of the substrate W (or the upper surface 21 of the substrate holding stage 20 when no substrate W is placed), and the tips of the discharge heads 31a and 31b of the nozzle 30 at the treatment position TP1. The peripheral area PA1 may include a part of each element such as the side wall 11 of the chamber 10 and the nozzle arm 32.

When the substrate W is not held on the substrate holding stage 20 (that is, the substrate W is not in the predetermined position), the thermography to be acquired includes the temperature distribution on the upper surface 21 of the substrate holding stage 20. When the substrate W is held on the substrate holding stage 20 (that is, when the substrate W is in the predetermined position), the upper surface 21 of the substrate holding stage 20 is arranged on the back side of the substrate W. Therefore, the thermography to be acquired does not include the temperature distribution on the upper surface 21. Further, when the nozzle 30 is arranged at the treatment position TP1, a part of the nozzle 30 (for example, the discharge heads 31a and 31b) is included in the thermography. In this manner, due to the change in the elements included in the imaging area PA of the thermographic camera 70, the elements included in the thermography also change, depending on the situation.

The controller 9 controls the operation of each element of the substrate treatment device 100. The configuration of the controller 9 as hardware is the same as that of a typical computer. That is, the controller 9 includes a CPU that performs various arithmetic processes, a ROM being a read-only memory that stores basic programs, a RAM being a read/write memory that stores various information, and a storage unit 91 that stores a control application, data, and the like.

A display unit 92, an operation unit 93, and a notification unit 94 are connected to the control unit 9. The display unit 92 is a display device that displays various images in accordance with an image display signal from the controller 9. The operation unit 93 is an input device such as a mouse and a keyboard that accepts the input operation by an operator.

The notification unit 94 has a function of notifying, when an abnormality to be notified to the operator occurs in each cleaning treatment unit 1. An alarm such as a lamp or a buzzer may be adopted as the notification unit 94. For example, when an etching determination unit 9031 determines that the etching treatment performed by each cleaning treatment unit 1 is unsatisfactory, the notification unit 94 notifies the outside of the result. Note that, it may be adopted that the display unit 92 displays a default image such as a warning screen. In this manner, the display unit 92 may function as a notification unit.

When the CPU operates in accordance with the control application program stored in the storage unit 91 or the like, the controller 9 functions as a thermography generator 901, a feature value calculator 902, a predetermined treatment execution unit 903, and a relational expression generator 904. Note that some or all of these functions may be realized hardware wise by a dedicated circuit.

The thermography generator 901 generates a thermography based on an output signal of the thermographic camera 70. The thermography is an image indicating the temperature distribution in the imaging area of the thermographic camera 70.

The feature value calculator 902 calculates the feature value from the temperature distribution indicated by the thermography generator 901. The feature value is a value related to the etching amount of the substrate W by the etching treatment using the etching solution executed in the cleaning treatment unit 1.

The predetermined treatment execution unit 903 executes predetermined treatments according to the feature value calculated by the feature value calculator 902. The predetermined treatment execution unit 903 includes the etching determination unit 9031, a temperature controller 9032, a schedule change unit 9033, and an output controller 9034.

The relational expression generator 904 generates a relational expression 912 expressing the correspondence between the temperature distribution (thermography) in the peripheral area PA1 and the etching amount of the substrate W after the predetermined etching treatment is performed. The relational expression 912 may be acquired by an experimentally performed etching treatment in each cleaning unit 1. In addition, the relational expression 912 may be acquired by simulation.

The etching determination unit 9031 determines a quality of the etching treatment for the substrate W based on the comparison between the appropriately determined determination threshold value 914 and the feature value calculated by the feature value calculator 902. The temperature controller 9032 controls the heat source 25 in accordance with the thermography acquired by the thermographic camera 70.

The schedule change unit 9033 changes the schedule that defines the time of each treatment executed in each cleaning treatment unit 1. The schedule defines, for example, a treatment schedule in which the substrate W is carried into each chamber 10, a discharge time for the treatment solution to be discharged from the nozzle 30 to the substrate W, and the like. The output controller 9034 controls the operations of the display unit 92 and the notification unit 94, which are output devices. For example, the output controller 9034 causes the display unit 92 to display various images or causes the notification unit 94 to perform notification in accordance with the result of the determination performed by the etching determination unit 9031.

<Relational Expression Generation Treatment by Relational Expression Generator 904>

The relational expression 912 is a mathematical expression for obtaining, from the temperature distribution of the peripheral area PA1 around the substrate W, a prediction value of the etching amount when the etching treatment is performed under the temperature distribution condition. The relational expression 912 is obtained by performing a multiple regression analysis with the etching amount as the objective variable (dependent variable) and the temperature distribution indicated by thermography as the explanatory variable (independent variable).

Specifically, in the cleaning treatment unit 1, the etching treatment is performed under different conditions, and the data set of the thermography and the etching amount of the substrate W obtained at that time are prepared in advance. The different conditions may be a case where the treatment conditions are the same and the production lots are different or a case where the temperature condition of at least one of the substrate W and peripheral area PA1 is different.

The thermography corresponding to the independent variable (explanatory variable) of the relational expression 912 is acquired at a predetermined timing in the etching treatment. The etching treatment includes a carrying-in stage in which the main transfer robot 103 carries the substrate W into the chamber 10, an etching solution supplying stage in which the etching solution is supplied to the substrate W held on the substrate holding stage 20 to treat the substrate W, and a rinsing solution supplying stage in which the rinsing solution is supplied to the substrate W to treat the substrate W. The carrying-in stage is a state in which the substrate W is not held on the substrate holding stage 20. Therefore, if the predetermined timing is set to the carrying-in stage, the thermography to be acquired does not include the temperature distribution information of the upper surface W1 of the substrate W, but includes the temperature distribution information of the upper surface 21 of the substrate holding stage 20. In the stages after the carrying-in stage, the substrate W is held on the substrate holding stage 20. If the predetermined timing is set to the post carrying-in stage, the thermography to be acquired includes the temperature distribution information of the upper surface W1 of the substrate W.

Figure 4:
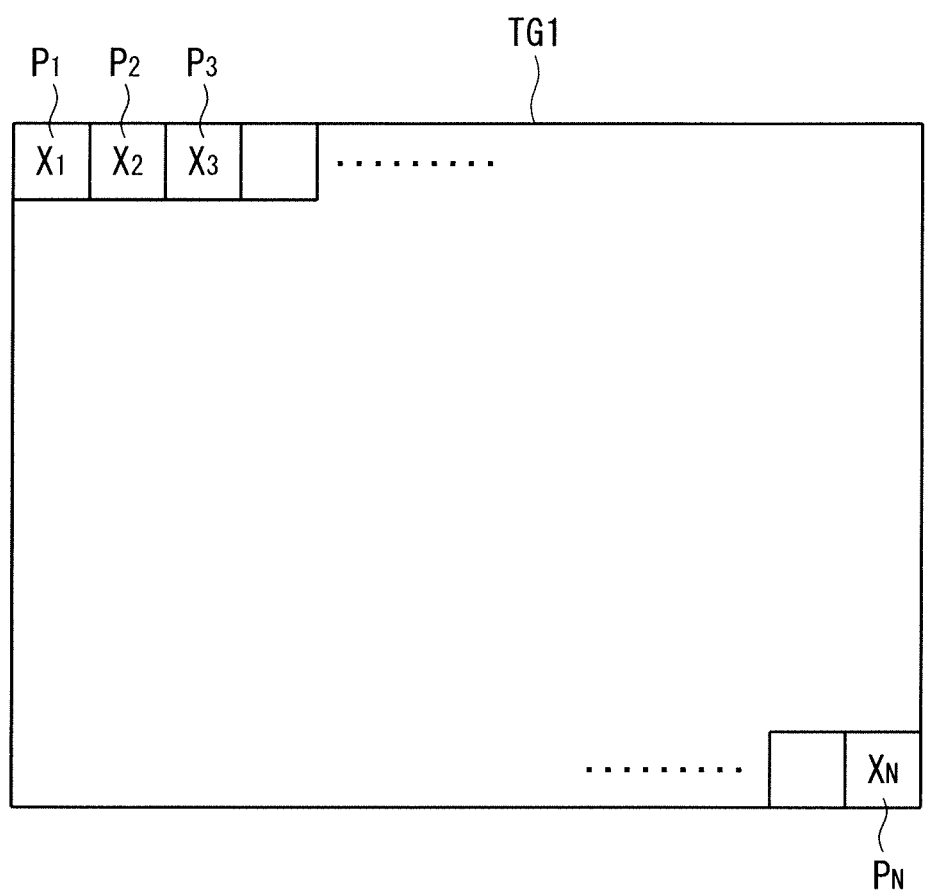
FIG. 4 A diagram conceptually illustrating a thermography TH1.

FIG. 4 is a diagram conceptually illustrating a thermography TH1. The thermography TH1 is composed of, for example, 640 pixels in the horizontal direction and 480 pixels in the vertical direction. A pixel value $X_j$ of each pixel $P_j$ (j is a natural number from 1 to N) indicates the temperature at the actual position corresponding to each pixel.

Figure 5:
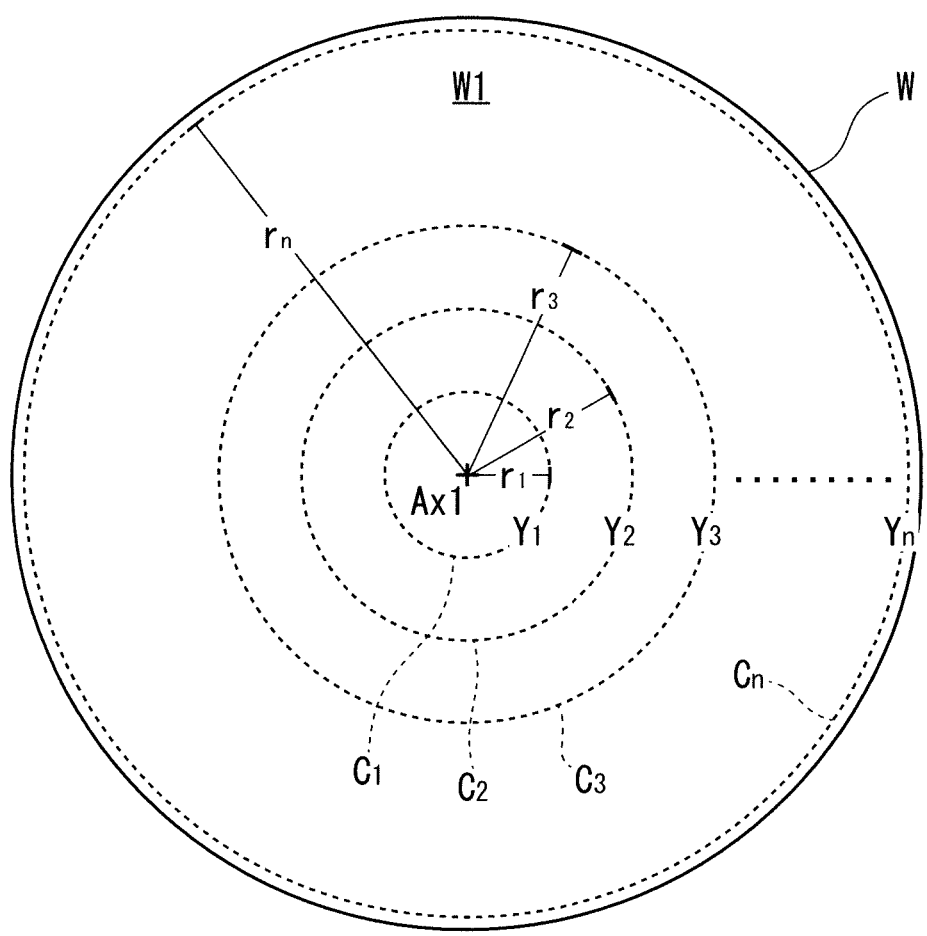
FIG. 5 A diagram illustrating an upper surface W1 of a substrate W.

FIG. 5 is a diagram illustrating an upper surface W1 of a substrate W. The etching amount is measured after each etching treatment performed under different conditions. The etching amount may be measured at only one specific point on the upper surface W1 of the substrate W, or may be measured at a plurality of different points on the upper surface W1. Further, for example, as illustrated in FIG. 5, an etching amount $Y_i$ may be obtained for each circumference $C_i$ having a different radius $r_i$ (i is a natural number from 1 to n), with the rotation axis Ax1 as the center. In this case, for each circumference, the average value of the etching amounts measured at a plurality of points on one circumference $C_i$ may be the etching amount $Y_i$ at that circumference $C_i$. Alternatively, for each circumference, the etching amount measured at only one point on one circumference $C_i$ may be the etching amount $Y_i$ of that circumference $C_i$.

In this manner, the reason for obtaining the etching amount for each circumference $C_i$ is that it is considered that the etching amount tends to be uniform on the same circumference $C_i$. In the cleaning treatment unit 1, the etching solution is supplied to the rotating substrate W, so that the etching solution supplied near the center of the substrate W (rotation axis Ax1) is concentrically spread from the center of the substrate W. Therefore, the thickness of the etching solution during the etching treatment tends to be substantially uniform over one turn at each circumference. Further, the substrate W rotates; therefore, it is considered that the influence of the temperature distribution in the peripheral area PA1 around the substrate W on the etching becomes uniform over one turn in each circumference. Therefore, the etching amount on the substrate W becomes uniform on the same circumference $C_i$. Therefore, the etching status on the upper surface W1 of the substrate W is appropriately grasped by obtaining the etching amount for each circumference having a different radius.

As described above, when the data set of the pixel value $X_j$ of the thermography and the etching amount $Y_i$ is prepared, the relational expression generator 904 obtains the relational expression 912 which is a regression function by performing a multiple regression analysis. Specifically, $\alpha_i$ (i is a natural number from 1 to N) and $\beta_{ij}$ (j is a natural number from 1 to n) in the regression function represented by following Expression (1) for each circumference $C_i$ (radial distance $r_i$) is obtained by performing the multiple regression analysis with the etching amount $Y_i$ as the objective variable (dependent variable) and the thermography pixel value $X_j$ as the explanatory variable (independent variable). Various machine learning methods such as L1 regularization (Lasso) regression, L2 regularization (Ridge) regression, and L1+L2 (Elastic Net) regularization regression may be adopted as the multiple regression analysis.

[Expression 1]

$$\text{Regression function } Y_i = \alpha_i + \sum_j (\beta_{ij} \times X_j) \qquad (1)$$

The predetermined timing is not limited to one. For example, a plurality of predetermined timings may be set. In this case, it is preferable to generate a regression function at each predetermined timing. In this case, the prediction value of the etching amount is calculated at each timing corresponding to each predetermined timing; therefore, the quality of etching is inspected at each timing. For example, a plurality of predetermined timings may be set for each of the stages before and after the substrate is carried in.

When performing etching treatment in the cleaning treatment unit 1, the feature value calculator 902 substitutes the thermography data obtained at the timing corresponding to the predetermined timing (the time at which the thermography used to generate the relational expression 912 is acquired) in the relational expression 912. When the relational expressions 912 are generated by using the thermography of a plurality of predetermined timings, the feature value calculator 902 substitutes the thermography data of each timing corresponding to each predetermined timing into the relational expression 912. The value calculated in this manner indicates a prediction value of the etching amount for each circumference $C_i$ that is expected to be obtained by the etching treatment for each circumference $C_i$. In this manner, by using the relational expression 912, the etching amount of the substrate W is predicted from the thermography obtained by imaging including the peripheral area PA1 around the substrate W.

<Determination Threshold Value>

The determination threshold value 914 is set for the etching determination unit 9031 to determine in advance whether or not the prediction value of the etching amount indicated by the feature value is appropriate. The determination threshold value 914 may include, for example, a quality reference value (maximum value $ST1_{max}$ and minimum value $ST1_{min}$) for the in-plane average value $Y_{Ave}$ (average value of etching amounts $Y_1$ to $Y_n$ of each circumference $C_1$ to $C_n$ of the substrate W) of the etching amount calculated by following Expression (2). In this case, the feature value calculator 902 may calculate the in-plane average value $Y_{Ave}$ as the feature value from the etching amounts $Y_1$ to $Y_n$ (prediction value) obtained from the relational expression 912 (regression function).

[Expression 2]

$$\text{In-plane average: } Y_{Ave} = \sum_i Y_i / n \quad (2)$$

The determination threshold value 914 may include a quality reference value (maximum value $ST2_{max}$) for an in-plane range $Y_{Ran}$ of the etching amount calculated by following Expression (3) (the difference between the maximum value and the minimum value in the etching amounts $Y_1$ to $Y_n$ of each circumference $C_1$ to $C_n$ of the substrate W). In this case, the feature value calculator 902 may calculate the in-plane range $Y_{Ran}$ as the feature value from the etching amounts $Y_1$ to $Y_n$ (prediction value) obtained from the relational expression 912 (regression function).

[Expression 3]

$$\text{In-plane range: } Y_{Ran} = \max_i\{Y_i\} - \min_i\{Y_j\} \quad (3)$$

$\max_i\{Y_i\}$ representing the maximum value in etching amounts $Y_1$ to $Y_n$ of each circumference $C_1$ to $C_n$ $\min_i\{Y_i\}$ representing the minimum value in etching amounts $Y_1$ to $Y_n$ of each circumference $C_1$ to $C_n$ In this manner, the determination threshold value includes the quality reference of the in-plane average value $Y_{Ave}$ of the etching amount and/or the in-plane range $Y_{Ran}$, therefore the quality of the etching treatment is appropriately determined from the calculated feature value.

<Etching Treatment Sequence>

Figure 6:
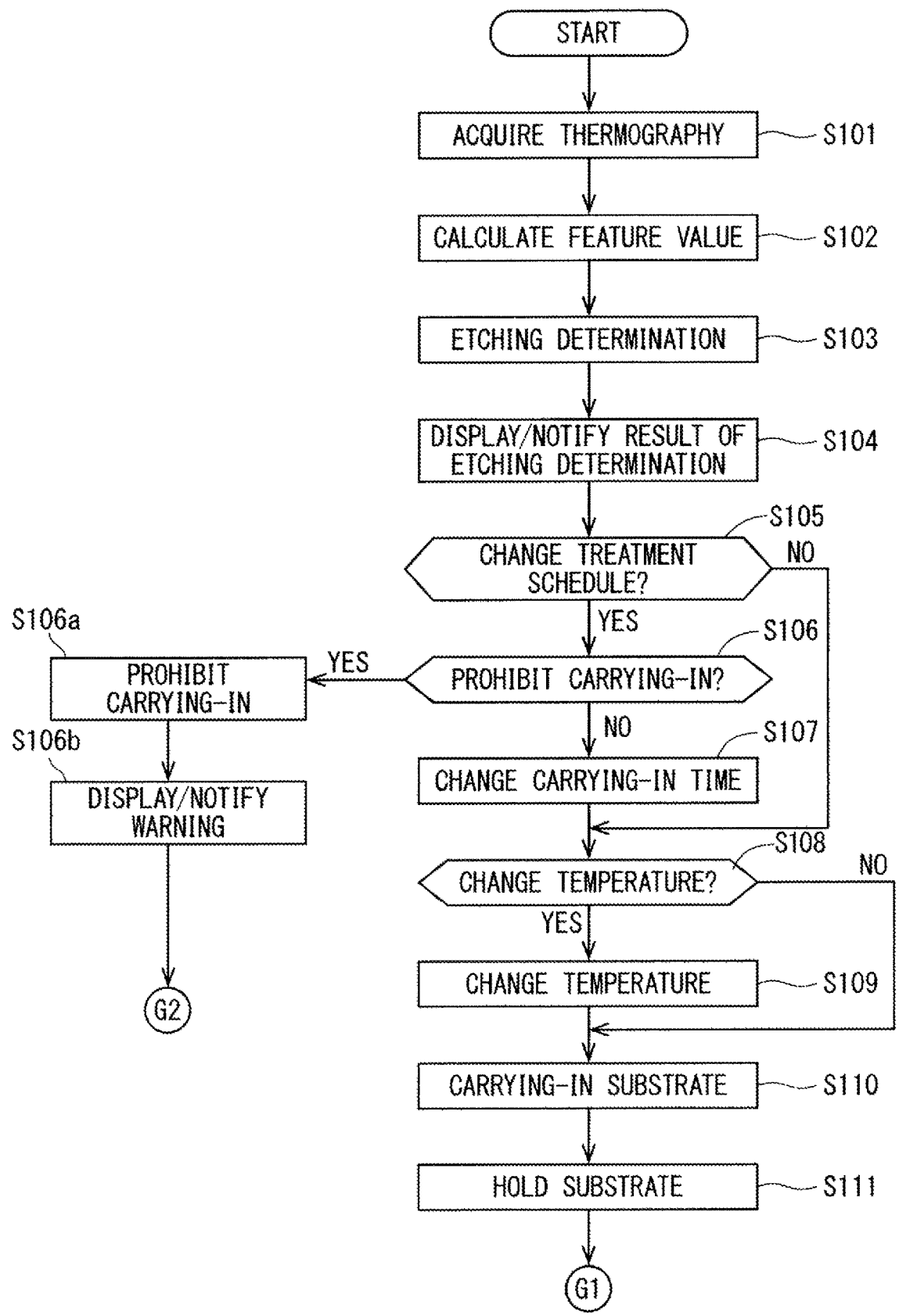
FIG. 6 A flowchart illustrating the first half of the sequence of etching treatment.
Figure 7:
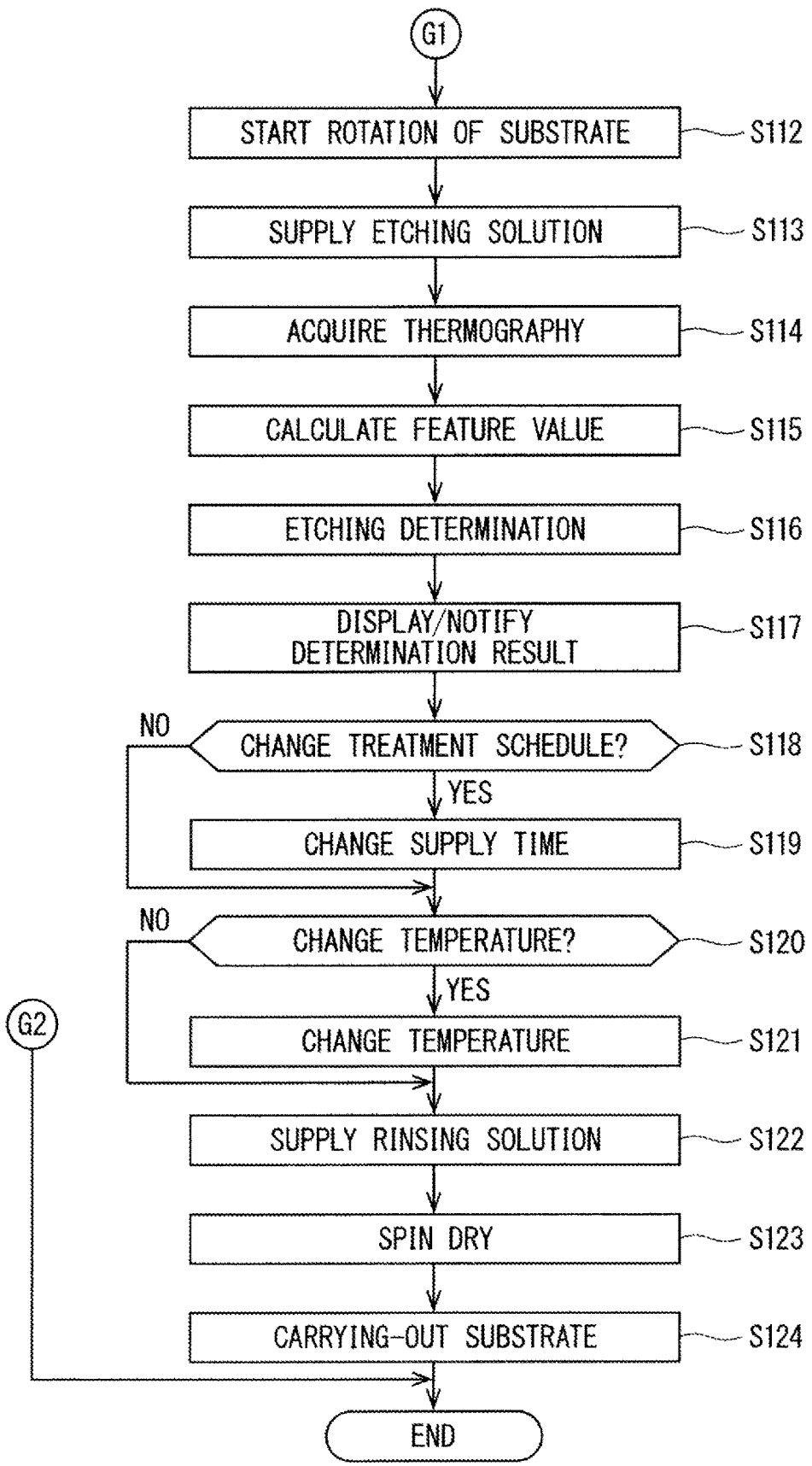
FIG. 7 A flowchart illustrating the latter half of the sequence of etching treatment.

Next, the sequence of etching treatment performed in the substrate treatment device 100 will be described. FIG. 6 is a flowchart illustrating the first half of the sequence of etching treatment. FIG. 7 is a flowchart illustrating the latter half of the sequence of etching treatment. Each treatment illustrated in FIGS. 6 and 7 shall be performed under the control of the controller 9 unless otherwise specified. A sequence illustrated in FIGS. 6 and 7 illustrates a series of treatments performed on one cleaning treatment unit 1 from the stage before the etching treatment object substrate W is carried in to the stage after the substrate W is treated with the etching solution and then carried out are shown for one cleaning treatment unit 1. The execution of each treatment illustrated in FIGS. 6 and 7 is not inevitable, and some of them may be omitted. Also, each treatment may be executed in a different order as far as consistency is maintained.

First, the thermography is acquired before the substrate W is carried into the chamber 10 of the cleaning treatment unit 1 by the main transfer robot 103 (FIG. 6: Step S101). Specifically, the thermographic camera 70 images the imaging area PA, and the thermography generator 901 generates the thermography based on the output signal. The substrate W is not held on the substrate holding stage 20; therefore, the generated thermography contains information on the temperature distribution of the upper surface 21 of the substrate holding stage 20 and the peripheral area PA1.

When the thermography is generated, the feature value calculator 902 calculates the feature value by substituting the thermography into the relational expression 912 (FIG. 6: Step S102). The relational expression 912 used here is a regression function generated from the data set of thermography in the pre-substrate carrying-in stage and the etching amount. By substituting the thermography into the relational expression 912, the prediction value of the etching amount at the pre-substrate carrying-in stage is obtained. Further, the feature value calculator 902 calculates a feature value for etching determination in the next step from the prediction value obtained from the relational expression 912. The feature value includes, for example, the in-plane average value $Y_{Ave}$ and the in-plane range $Y_{Ran}$ of the etching amount (prediction value).

When the feature value is calculated, the etching determination unit 9031 performs an etching determination (FIG. 6: Step S103). That is, the etching determination unit 9031 determines the quality of the etching treatment based on the comparison between the feature value obtained in Step S102 and the determination threshold value 914.

For example, when the quality reference value (maximum value $ST1_{max}$ and minimum value $ST1_{min}$) of the in-plane average value $Y_{Ave}$ of the etching amount is set as the determination threshold value 914, it is preferable to determine whether or not the in-plane average value of the circumferences $C_1$ to $C_n$ calculated as the feature value is within the range of the minimum value $ST1_{min}$ and the maximum value $ST1_{max}$, which is the quality reference value. When the in-plane average value $Y_{Ave}$ is within the range of the quality reverence value, a positive evaluation is given, and when it is outside of the range, a negative evaluation is given.

When the quality reference value (maximum value $ST2_{max}$) of the in-plane range $Y_{Ran}$ of the etching amount is set as the determination threshold value 914, it is preferable to determine whether or not the in-plane range $Y_{Ran}$ calculated as the feature value is smaller than the quality reference value. When the in-plane range $Y_{Ran}$ is equal to or less than the quality reference value a positive evaluation is given and exceeds the quality reference value, a negative evaluation is given.

After the etching determination, the output controller 9034 of the predetermined treatment execution unit 903 executes a treatment of displaying a positive or negative evaluation in accordance with the result of the etching determination on the display unit 92 or a treatment of notifying the notification unit 94 of the same (FIG. 6: Step S104). The treatment of Step S104 is an example of the predetermined treatment.

After the etching determination, the schedule change unit 9033 determines whether to change the treatment schedule of the substrate W (FIG. 6: Step S105). Specifically, when the etching determination result in Step S103 is a positive evaluation, the temperature distribution of the upper surface 21 of the substrate holding stage 20 and the peripheral area PA1 is in a preferable state. Therefore, the schedule change unit 9033 may determine in Step S105 that the change of the treatment schedule is unnecessary. In this case, the next Steps S106 and S107 are skipped.

Specifically, when the etching determination result in Step S103 is a negative evaluation, the temperature distribution of the upper surface 21 of the substrate holding stage 20 and the peripheral area PA1 is in an unpreferable state for the etching treatment. Therefore, the schedule change unit 9033 may determine in Step S105 that the change of the treatment schedule is necessary. In this case, the next Step S106 is performed.

Step S106 is a step in which the schedule change unit 9033 determines whether or not to prohibit the carrying-in to the chamber 10. For example, when the feature value acquired in Step S102 deviates from the determination threshold value 914 by more than a predetermined value, it is determined that the carrying-in of the substrate W to the corresponding chamber 10 is prohibited. When the carrying-in is prohibited (YES in Step S106), the treatment schedule is changed so that the carrying-in is not executed (FIG. 6: Step S106a). In addition, the schedule change unit 9033 displays a warning to the effect that the carrying-in is prohibited on the display unit 92 and notifies the notification unit 94 of the same (FIG. 6: Step S106b). After that, the controller 9 ends the sequence of etching treatment.

In Step S106, when the carrying-in of the substrate W is not prohibited (NO in Step S106), the schedule change unit 9033 changes the treatment schedule so as to delay the carrying-in time (FIG. 6: Step S107). Each treatment of changing a transport schedule, such as Steps S106a and 107, is an example of a predetermined treatment executed in accordance with the result of the etching determination.

When a negative evaluation is given in the etching determination in Step S103, the schedule change unit 9033 may change the treatment schedule so as to uniformly prohibit the carrying-in of the substrate W to the corresponding chamber 10.

After the etching determination, the temperature controller 9032 of the predetermined treatment execution unit 903 determines whether to change the temperature of the peripheral area PA1 (FIG. 6: Step S108). The determination may be executed, for example, based on a comparison between the thermography obtained in Step S101 and a standard thermography prepared in advance in the pre-substrate carrying-in stage (for example, comparison between average values).

When the temperature controller 9032 determines that the temperature is to be changed (YES in Step S108), the temperature controller 9032 changes the temperature in accordance with the state of the thermography (FIG. 6: Step S109). For example, when the thermography indicates a temperature higher than the standard, the heat source 25 gives less heat to the substrate holding stage 20, and in the opposite case, the heat source 25 gives more heat to the substrate holding stage 20. In this manner, the temperature controller 9032 changes the temperature of the peripheral area PA1 and the upper surface 21 of the substrate holding stage 20. The treatment of changing the temperature of the peripheral area PA1 is an example of the predetermined treatment executed in accordance with the result of the etching determination. If the temperature controller 9032 determines that the temperature is not changed (NO in Step S108), Step S109 is skipped.

Subsequently, the main transfer robot 103 carries the etching treatment object substrate W into the chamber 10 in accordance with the treatment schedule (FIG. 6: Step S110). The substrate W carried into the chamber 10 is held on the substrate holding stage 20 (FIG. 6: Step S111). Therefore, the substrate W is placed on the predetermined position. In this state, the controller 9 moves the nozzle 30 to the treatment position TP1 so that the state where the treatment solution can be supplied to the upper surface W1 of the substrate W is set.

When the substrate W is held on the substrate holding stage 20, the spin motor 22 starts the rotation of the substrate W (FIG. 7: Step S112). When the rotation speed of the substrate W reaches a predetermined rotation speed (for example, 300 rpm), the etching solution supply unit 37 of the treatment solution supply unit 36 supplies the etching solution to the nozzle 30. As a result, the etching solution is supplied from the nozzle 30 to the upper surface W1 of the substrate W (FIG. 7: Step S113). The etching solution supplied to the substrate W spreads over the entire upper surface W1 of the substrate W by the rotation of the substrate W to form a solution film. Accordingly, the etching reaction proceeds over the entire upper surface W1.

A thermography is acquired while the etching solution is being supplied (FIG. 7: Step S114). The thermography generator 901 generates a thermography from the image data of the thermographic camera 70. The thermography obtained at this stage includes information on the temperature distribution on the upper surface W1 of the substrate W and the peripheral area PA1.

When the thermography is acquired, the feature value calculator 902 calculates the feature value by substituting the thermography into the relational expression 912 (FIG. 7: Step S115). The relational expression 912 used here is a regression function generated from the data set of thermography in the etching solution supplying stage after the substrate is carried-in and the etching amount. By substituting the thermography into the relational expression 912, the prediction value of the etching amount at the etching solution supplying stage is obtained. Further, the feature value calculator 902 calculates a feature value for etching determination in the next step from the prediction value obtained from the relational expression 912. The feature value includes, for example, the in-plane average value $Y_{Ave}$ and the in-plane range $Y_{Ran}$ of the etching amount (prediction value).

When the feature value is calculated, the etching determination unit 9031 performs an etching determination (FIG. 7: Step S116). That is, the etching determination unit 9031 determines the quality of the etching treatment based on the comparison between the feature value obtained in Step S102 and the determination threshold value 914. This determination treatment is the same as Step S103 illustrated in FIG. 6.

After the etching determination, the output controller 9034 of the predetermined treatment execution unit 903 executes a treatment of displaying a positive or negative evaluation in accordance with the result of the etching determination on the display unit 92 or a treatment of causing the notification unit 94 to notify the same (FIG. 7: Step S117). The treatment of Step S117 is an example of the predetermined treatment.

After the etching determination, the schedule change unit 9033 determines whether to change the treatment schedule in accordance with the result of the etching determination (FIG. 7: Step S118). When the etching determination result in Step S103 is a positive evaluation, the temperature distribution of the upper surface W1 of the substrate W and the peripheral area PA1 is in a preferable state. In this case, the schedule change unit 9033 may determine in Step S118 that the change of the treatment schedule is unnecessary. In this case, the next Step S119 is skipped.

When the etching determination result in Step S116 is a negative evaluation, the temperature distribution of the upper surface W1 of the substrate W1 and the peripheral area PA1 is in an unpreferable state for the etching treatment. Therefore, the schedule change unit 9033 may determine in Step S118 that the change of the treatment schedule is necessary. In this case, the schedule change unit 9033 changes the treatment schedule so that the supply time of the etching solution is changed (FIG. 7: Step S119).

After the etching determination, the temperature controller 9032 of the predetermined treatment execution unit 903 determines whether to change the temperature of the peripheral area PA1 (FIG. 7: Step S120). The determination may be executed, for example, based on a comparison between the thermography obtained in Step S114 and a standard thermography prepared in advance in the etching solution supplying stage (for example, comparison between average values).

When the temperature controller 9032 determines that the temperature is to be changed (YES in Step S120), the temperature controller 9032 changes the temperature in accordance with the state of the thermography (FIG. 7: Step S121). For example, when the thermography indicates a temperature higher than the standard, the heat source 25 gives less heat to the substrate holding stage 20, and in the opposite case, the heat source 25 gives more heat to the substrate holding stage 20. In this manner, the temperature controller 9032 changes the temperature of the peripheral area PA1 and the upper surface W1 of the substrate W. The treatment of changing the temperature of the peripheral area PA1 is an example of the predetermined treatment performed in accordance with the result of the etching determination. If the temperature controller 9032 determines that the temperature is not changed (NO in Step S120), Step S121 is skipped.

After Step S121, the controller 9 controls the treatment solution supply unit 36 to stop the supply of the etching solution to the nozzle 30 and start the supply of the rinsing solution in accordance with the treatment schedule. Accordingly, the rinsing solution is supplied from the nozzle 30 to the upper surface W1 of the substrate W (FIG. 7: Step S122). When the time predetermined in the treatment schedule elapses, the controller 9 stops the supply of the rinsing solution to the nozzle 30.

When the supply of the rinsing solution is stopped, the controller 9 performs a spin dry treatment (FIG. 7: Step S123), that is, the controller 9 controls the spin motor 22 to increase the rotation speed. Accordingly, the rinsing solution remaining on the upper surface W1 of the substrate W is scattered outward in the radial direction. As a result, the upper surface W1 of the substrate W is dried. When the time predetermined in the treatment schedule elapses, the controller 9 stops the rotation of the substrate W.

When the spin drying treatment is completed, the substrate holding stage 20 releases the adsorption of the substrate W, thereby releasing the holding of the substrate W. After that, the main transfer robot 103 carries out the substrate W from the chamber 10 (FIG. 7: Step S124).

Effect

According to the substrate treatment device 100, not only the temperature distribution of an occupied area occupied by the substrate W but also the temperature distribution of the peripheral area PA1 around the occupied area is acquired. By substituting the temperature distribution of this peripheral area PA1 into the relational expression 912, the feature value regarding the prediction value of the etching amount is calculated. This ensures the accurate calculation of the predicted etching amount.

Further, by obtaining the feature value regarding the etching amount, various predetermined treatments suitable for the etching treatment are executed at respective stages of the etching treatment in accordance with the temperature distribution of the peripheral area PA1.

2. Embodiment 2

Next, Embodiment 2 will be described. In the following description, elements having the same functions as the elements already described may be given the same symbols or a symbol to which alphabetic letters are added, and detailed description may be omitted.

Figure 8:
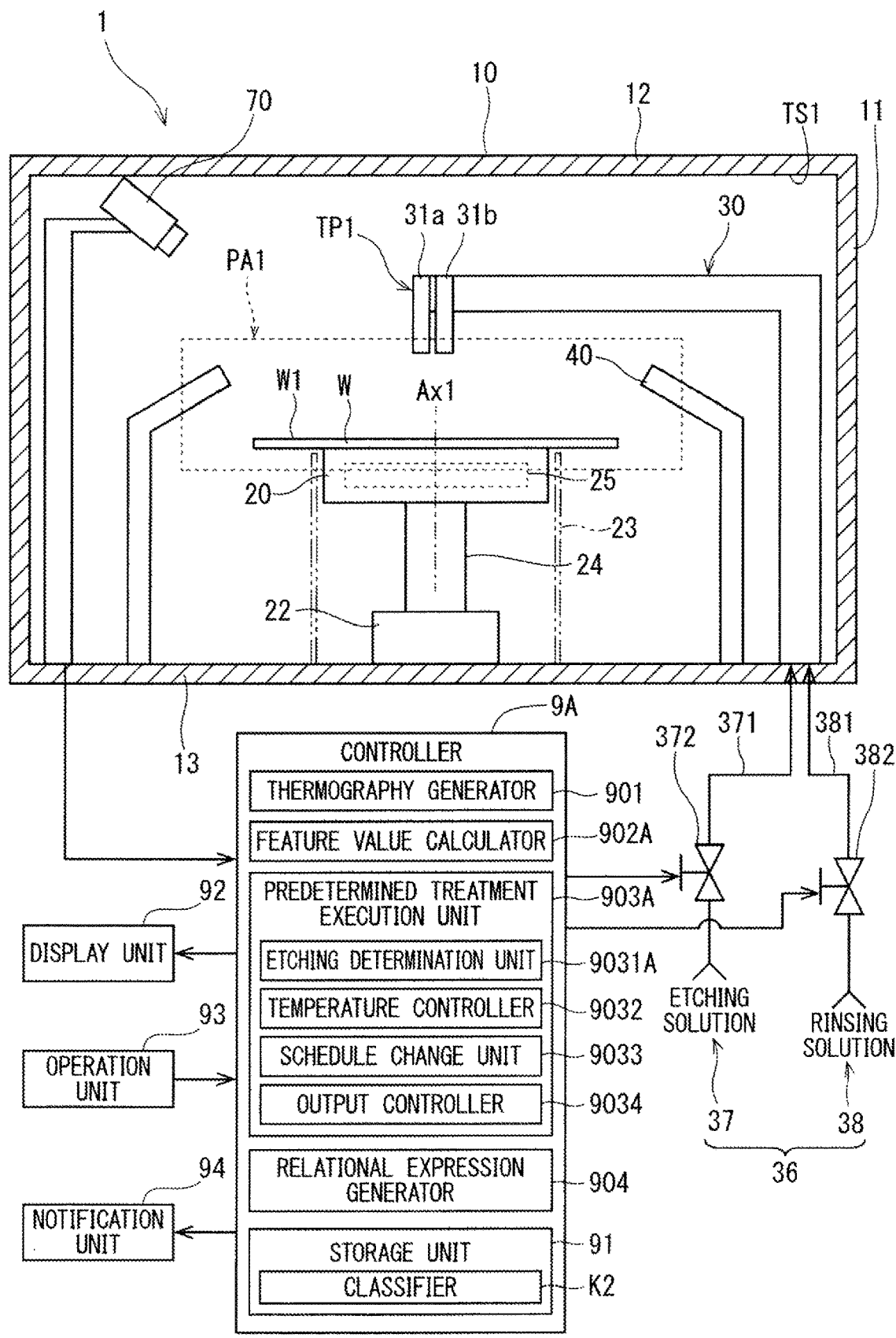
FIG. 8 A diagram illustrating a cleaning treatment unit 1 and a controller 9A according to Embodiment 2.

FIG. 8 is a diagram illustrating a cleaning treatment unit 1 and a controller 9A according to Embodiment 2. The controller 9A of Embodiment 2 includes a feature value calculator 902A and a predetermined treatment execution unit 903A. The predetermined treatment execution unit 903A includes an etching determination unit 9031A.

The feature value calculator 902A calculates a feature vector, which is an array of a plurality of types of feature amounts, as a feature value from the thermography generated by the thermography generator 901. As the feature amounts, for example, the sum of the pixel values of the thermographic image and the standard deviation of the pixel values are adoptable. Also, the pixel value of each pixel of the thermography may be used as it is as a feature vector.

The etching determination unit 9031A performs the etching determination using a classifier K2 that classifies between a class with satisfactory etching and a class with unsatisfactory etching based on the feature vector calculated from the thermography. The class with satisfactory etching is a class indicating that the etching treatment is satisfactory, and the class with unsatisfactory etching is a class indicating that the etching treatment is unsatisfactory. When the classification object thermography is classified into the class with satisfactory etching, the etching determination unit 9031A gives a positive evaluation. When the classification object thermography is classified into the class with unsatisfactory etching, the etching determination unit 9031A gives a negative evaluation.

The classifier K2 is generated by machine learning using the thermography (temperature distribution) and the data set of etching amount of the substrate W obtained when etching is performed in the cleaning treatment unit 1 under different conditions as in the case of obtaining the relational expression 912. Specifically, for each thermography, training data is prepared in which a class based on the result of the etching amount is instructed. When instructing a class to a thermography, it is preferable that a class with satisfactory etching is instructed when the actual etching amount is satisfactory, and a class with unsatisfactory etching is instructed in the opposite case. Therefore, the training data consisting of a plurality of sets of thermography (specifically, a feature vector) and instructed classes are prepared in advance. Then, the classifier K2 is generated by performing machine learning using the training data. As machine learning, known methods such as neural networks, decision trees, support vector machines (SVM), and discriminant analyses may be adopted.

A generator that generates the classifier K2 by machine learning may be provided with the substrate treatment device 100, or may be provided in a device (such as a server) outside the substrate treatment device 100. In the latter case, the classifier K2 may be provided to the substrate treatment device 100 via a network or through various portable media.

According to the substrate treatment device 100 of Embodiment 2, a feature vector is calculated as a feature value from the thermography of the area including the peripheral area PA1, and satisfactory etching or unsatisfactory etching is determined, based on the feature vector. Therefore, the quality of etching is accurately determined at each stage of the etching treatment. Further, depending on the result of the etching determination, the predetermined treatment suitable for the etching treatment is performed.

While the invention has been described in detail, the forgoing description is in all aspects illustrative and not restrictive. It is understood that numerous other modifications can be devised without departing from the scope of the invention. It should be noted that Embodiments and Modifications of the present invention can be arbitrarily combined and can be appropriately omitted unless they contradict each other.

EXPLANATION OF REFERENCE SIGNS 1 cleaning treatment unit
10 chamber
11 side wall
20 substrate holding stage
21 upper surface
22 spin motor
25 heat source
30 nozzle
36 treatment solution supply unit
37 etching solution supply unit
40 treatment cup
70 thermographic camera
9, 9A controller
91 storage unit
92 display unit
93 operation unit
94 notification unit
901 thermography generator
902, 902A feature value calculator
903, 903A predetermined treatment execution unit
9031, 9031A etching determination unit
9032 temperature controller
9033 schedule change unit
9034 output controller
904 relational expression generator
912 relational expression (regression function)
914 determination threshold value
100 substrate treatment device
103 main transfer robot
Ax1 rotation axis
K2 classifier
PA imaging area
PA1 peripheral area
TH1 thermography
TS1 treatment space
W substrate
W1 upper surface
$Y_{Ave}$ in-plane average value (feature value)
$Y_{Ran}$ in-plane range (feature value)
$Y_i$ etching amount
$r_i$ radial distance

The invention claimed is:

1. A substrate treatment device configured to perform etching on a substrate, comprising:
    a chamber having a treatment space therein;
    a substrate holder configured to hold the substrate in a predetermined position in the chamber;
    a nozzle configured to supply an etching solution to the substrate held by the substrate holder, in relation to an etching amount associated with the substrate;
    a spin motor configured to rotate the substrate holder about a predetermined rotation axis;
    a thermographic camera configured to acquire a temperature distribution in a peripheral area around a substrate area occupied by the substrate when arranged at the predetermined position in the chamber; and
    a controller configured to:
    a) cause the substrate holder to hold the substrate in the predetermined position in the chamber;
    b) cause the substrate holder to rotate the substrate in the predetermined position about a rotation axis;
    c) cause the nozzle to supply the etching solution to a surface of the substrate;
    d) cause the thermographic camera to acquire the temperature distribution in an upper surface of the substrate holder and a peripheral area around the substrate area occupied by the substrate when arranged at the predetermined position in the chamber;
    e) calculate a feature value for evaluation of an etching treatment to be used in the supplying of the etching solution from the temperature distribution acquired by the thermographic camera;
    f) determine if the feature value exceeds a threshold value; and
    g) change a schedule that defines a time for the substrate to be carried into the chamber; wherein if the feature value exceeds the threshold value, the schedule is changed so that the substrate is not transferred into the chamber; and
    wherein the thermographic camera is configured to image an imaging area that includes the upper surface of the substrate holder, the peripheral area and an area where the substrate held on the substrate holder is arranged, and the temperature distribution being provided in the form of a thermography.

2. The substrate treatment device according to claim 1, further comprising
    an etching determination unit configured to determine a quality of the etching on the substrate based on comparison between the feature value and the threshold value.

3. The substrate treatment device according to claim 1, wherein
    the calculates controller is configured to calculate the feature value from a relational expression representing a relationship between the temperature distribution and the etching amount.

4. The substrate treatment device according to claim 3, wherein
    the controller is configured to generate the relational expression based on the temperature distribution at a predetermined timing in the etching and the etching amount of the substrate on which the etching has been performed.

5. The substrate treatment device according to claim 4, wherein
    the controller is configured to calculate the feature value by substituting the temperature distribution at a timing corresponding to the predetermined timing in the etching into the relational expression.

6. The substrate treatment device according to claim 3, wherein
the etching amount is an etching amount on each circumference having a different radius with the rotation axis being a center.

7. The substrate treatment device according to claim 6, wherein the relational expression is a regression function in which a temperature indicated by each pixel value constituting the thermography is an independent variable and the etching amount on each circumference of the different radius is a dependent variable.

8. The substrate treatment device according to claim 1, wherein
the controller is configured to calculate the feature value from the temperature distribution acquired in a state where the substrate holder does not hold the substrate.

9. The substrate treatment device according to claim 8, further comprising
a temperature change unit configured to change the temperature of the substrate arranged at the predetermined position and the peripheral area in accordance with the feature value.

10. The substrate treatment device according to claim 1, wherein
the controller is configured to calculate the feature value from the temperature distribution acquired in a state where the substrate holder holds the substrate.

11. The substrate treatment device according to claim 10, further comprising
a temperature change unit configured to change the temperature of the substrate arranged at the predetermined position and the peripheral area in accordance with the feature value.

12. The substrate treatment device according to claim 10, wherein
the controller is configured to change a schedule that defines a time for the substrate to be carried into the chamber according to the feature value.

13. A substrate treatment method comprising:
a) holding a substrate in a predetermined position in a chamber;
b) rotating the substrate in the predetermined position about a rotation axis;
c) supplying an etching solution to a surface of the substrate being rotated by the step b);
d) acquiring a temperature distribution in an upper surface of the substrate holder and a peripheral area around a substrate area occupied by the substrate when arranged at the predetermined position in the chamber, the temperature distribution being a thermography acquired by a thermographic camera;
e) calculating a feature value for evaluation of an etching treatment using to be used in the supplying of the etching solution from the temperature distribution acquired by the thermographic camera
f) determining if the feature value exceeds a threshold value; and
g) changing a schedule that defines a time for the substrate to be carried into the chamber;
wherein if the feature value exceeds the threshold value, the schedule is changed so that the substrate is not transferred into the chamber.

* * * * *